United States Patent
Kim et al.

(10) Patent No.: US 7,202,160 B2
(45) Date of Patent: Apr. 10, 2007

(54) METHOD OF FORMING AN INSULATING STRUCTURE HAVING AN INSULATING INTERLAYER AND A CAPPING LAYER AND METHOD OF FORMING A METAL WIRING STRUCTURE USING THE SAME

(75) Inventors: Yoon-Hae Kim, Sungnam-si (KR); Kyung-Tae Lee, Gawcheon-si (KR); Yong-Jun Lee, Gunpo-si (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 10/899,934

(22) Filed: Jul. 27, 2004

(65) Prior Publication Data

US 2005/0026422 A1    Feb. 3, 2005

(30) Foreign Application Priority Data

Jul. 28, 2003   (KR) ............... 10-2003-0052008

(51) Int. Cl.
*H01L 21/4763* (2006.01)
(52) U.S. Cl. .............. 438/624; 438/626; 438/778
(58) Field of Classification Search ........ 438/618–627, 438/629, 631, 633, 634, 637, 638, 641, 643, 438/647, 648, 653, 656, 672, 680, 683, 685, 438/687, 691, 674, 758, 761, 787, 788, 789, 438/778; 427/452
See application file for complete search history.

(56) References Cited

U.S. PATENT DOCUMENTS

| | | | |
|---|---|---|---|
| 6,486,059 B2 * | 11/2002 | Lee et al. ............. | 438/637 |
| 6,576,545 B1 * | 6/2003 | Hopper et al. ........ | 438/624 |
| 6,627,532 B1 | 9/2003 | Gaillard et al. ....... | 438/623 |
| 6,656,837 B2 * | 12/2003 | Xu et al. ............. | 438/676 |
| 6,974,766 B1 * | 12/2005 | Huang ................ | 438/624 |
| 2002/0106891 A1 | 8/2002 | Kim et al. ............ | 438/624 |
| 2004/0041239 A1 * | 3/2004 | Ruelke et al. ........ | 257/637 |
| 2004/0087179 A1 * | 5/2004 | San et al. ............ | 438/765 |

FOREIGN PATENT DOCUMENTS

| | | |
|---|---|---|
| KR | 20010051102 | 6/2001 |
| KR | 1020020027269 | 4/2002 |
| KR | 1020020045494 | 6/2002 |

* cited by examiner

*Primary Examiner*—Brook Kebede
(74) *Attorney, Agent, or Firm*—Mills & Onello LLP

(57) ABSTRACT

In a method of forming an insulating structure, an insulating interlayer is formed on a substrate using a silicon source gas and a reaction gas. A capping layer is formed in-situ on the insulating interlayer by increasing a flow rate of an oxidizing gas included in the reaction gas so that the capping layer has a second thickness when the insulating interlayer is formed on the substrate to have a first thickness. The insulating structure dose not have an interface between the insulating interlayer and the capping layer so that the insulating interlayer is not subject to damage by a cleaning solution during a subsequent cleaning process, since the cleaning solution maynot permeate into the insulating structure. Additionally, leakage current is mitigated or eliminated between the insulating interlayer and the capping layer, thereby improving the reliability of a semiconductor device including the insulating structure.

17 Claims, 11 Drawing Sheets

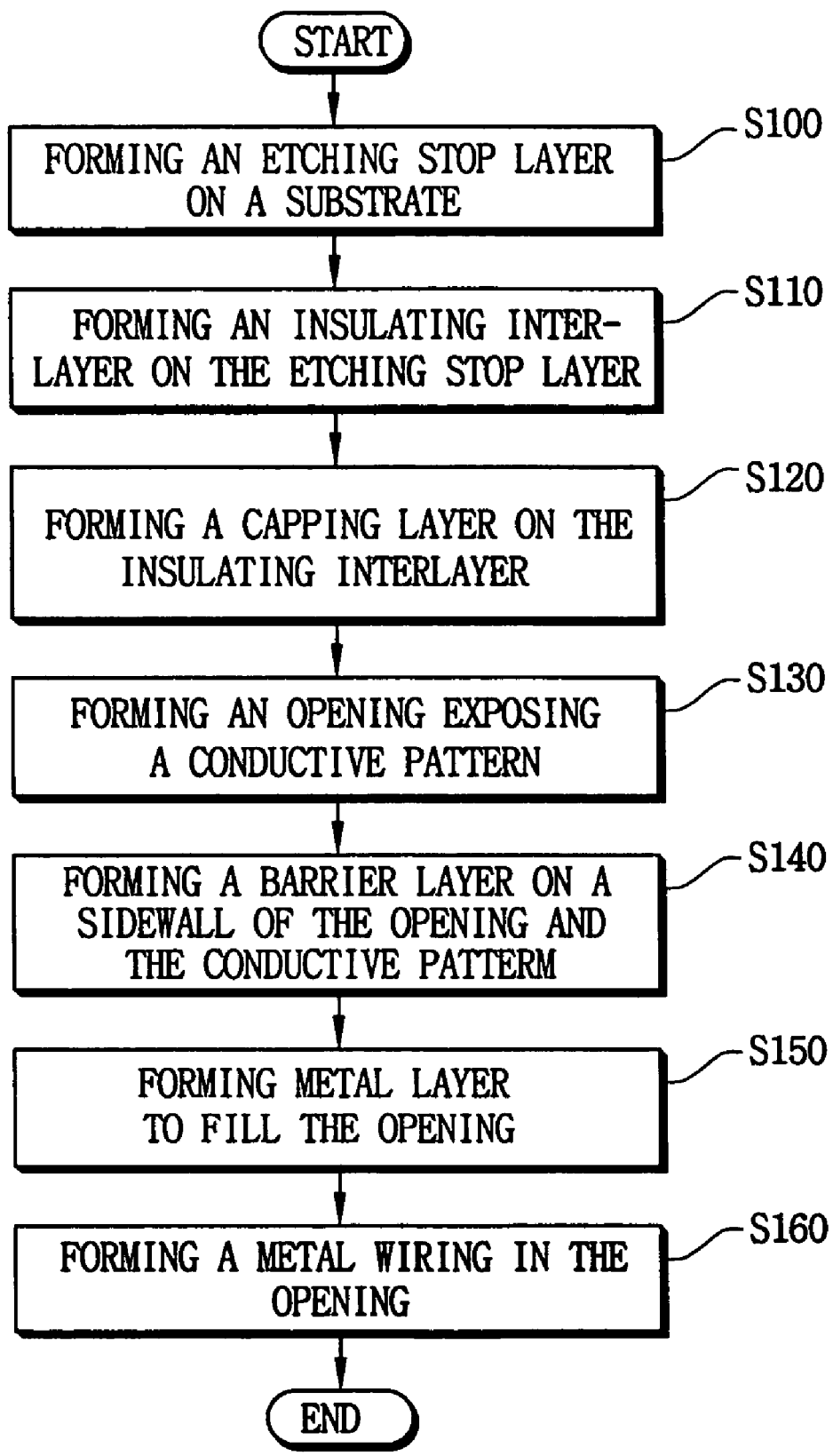

METHOD OF FORMING AN INSULATING STRUCTURE HAVING AN INSULATING INTERLAYER AND A CAPPING LAYER AND METHOD OF FORMING A METAL WIRING STRUCTURE USING THE SAME

CROSS REFERENCE TO RELATED APPLICATION

This application claims priority under 35 USC § 119 to Korean Patent Application No. 2003-52008, filed on Jul. 28, 2003, the contents of which are herein incorporated by reference in their entirety.

BACKGROUND OF THE INVENTION

1. Field of the Invention

The present invention relates to a method of forming an insulating structure including an insulating interlayer and a capping layer, and a method of forming a metal wiring structure through the insulating structure. More particularly, the present invention relates to a method of forming an insulating structure including an insulating interlayer and a capping layer without an interface between the insulating interlayer and the capping layer, and a method of forming a semiconductor device including a metal wiring structure using the insulating structure.

2. Description of the Related Art

As information processing apparatus continue to enjoy widespread use, semiconductor devices included in the information processing apparatus are developed to have ever-increasing response speed and storage capacity. Semiconductor manufacturing technologies continue to advance with improvements in the reliability and degree of integration of the semiconductor devices, as the design rule of the semiconductor devices becomes reduced.

In a conventional semiconductor device, a metal wiring structure is generally formed using aluminum (Al) because aluminum has relatively low contact resistance and aluminum wiring is readily formed under conventional processes. However, as the design rule of the semiconductor device is reduced, aluminum-based wiring is not as advantageous, since it is subject to failures due to resistance-capacitance (RC) delay, electro-migration (EM), stress migration (SC), and the like. In addition, the aluminum wiring may limit the semiconductor device with its relatively low response speed.

Recently, copper (Cu) wiring has become popular for use in the metal wiring structure of a semiconductor device since the copper wiring offers the advantages of relatively low resistance and electro-migration. The copper wirings are generally employed using insulation layers having a low dielectric constant. The insulation layers, commonly including nitride or oxide, are used as an etch stop layer, an insulating interlayer, a capping layer or a spacer in the fabrication process. For example, a silicon nitride layer has a specific dielectric constant of about 8 so that the silicon nitride layer is advantageously used as the etching stop layer, the capping layer or the spacer. A silicon oxide layer has a specific dielectric constant of about 3.7 to about 4.0 such that the silicon oxide layer is advantageously used as the insulating interlayer.

The insulation layer including oxide is commonly formed using a spin-on-glass (SOG) based material such as hydrosilsesquioxane (HSQ) or methyl-silsesquoxan (MSQ), organic polymers, silicon oxycarbonate (SiOC), and other suitable materials. An SOG-based oxide layer has some disadvantages such as a relatively low dielectric constant and poor density. Thus, it is impractical to form a contact hole or a trench through the SOG base layer since the SOG base layer is readily etched during an etching process. In addition, moisture and contaminants may be readily permeated into the SOG based layer in the case where the SOG based layer is not completely cured under a subsequent curing process after forming the SOG based layer.

A silicon oxycarbonate SOG layer may be formed using methyl-silsesquioxane (MSQ) in a spin coating process. A silicon oxycarbonate layer may also formed by a plasma enhanced chemical vapor deposition process using a source gas, a reaction gas including oxygen and a carrier gas including nitrogen ($N_2$), ammonia ($NH_3$), helium (He) or argon (Ar). The silicon oxycarbonate layer has a specific dielectric constant of about 2.7 to about 2.9 and a parasitic capacitance that is relatively lower than that of the silicon oxide layer by about 25 to about 30 percent. However, the silicon oxycarbonate layer is limited by several disadvantages as follows.

When forming the silicon oxycarbonate layer, a footing of a photoresist pattern may be generated when the photoresist pattern is formed on the silicon oxycarbonate layer. In addition, the silicon oxycarbonate layer has poor mechanical strength so that micro-scratches and exfoliation may be frequently generated on the silicon oxycarbonate layer when a trench is formed through the silicon oxycarbonate layer by etching the silicon oxycarbonate layer and forming a metal wiring structure in the trench by a chemical mechanical polishing (CMP) process.

To overcome the above-mentioned limitations, a method of forming a thin capping layer on the silicon oxycarbonate layer has been developed. The object of the capping layer is to prevent damage to the silicon oxycarbonate layer during the CMP process. However, when the capping layer is formed on the silicon oxycarbonate layer using a source gas including tetraethylorthosilane (TEOS) by a PECVD process, the capping layer may not be uniformly formed on the silicon oxycarbonate layer or the capping layer may be lifted from the silicon oxycarbonate layer because the capping layer may not be sufficiently adhered to the underlying silicon oxycarbonate layer. FIG. 1 is an electron microscopic picture illustrating a silicon oxycarbonate layer and a capping layer formed in accordance with the conventional approach. Furthermore, since an interface is generated between the capping layer and the silicon oxycarbonate layer, cleaning solution may permeate into the interface, thereby causing damage to the silicon oxycarbonate layer. Also, leakage current may be generated at the interface between the capping layer and the silicon oxycarbonate layer.

SUMMARY OF THE INVENTION

The present invention is directed to a method of forming an insulating structure having an insulating interlayer and a capping layer without formation of an interface between the insulating interlayer and the capping layer.

The present invention is further directed to a method of forming a semiconductor device including a metal wiring structure by employing the above insulating structure so as to prevent damage to the insulating interlayer and so as to mitigate or prevent leakage current generated at the interface between the insulating interlayer and the capping layer.

In accordance with one aspect of the present invention, there is provided a method of forming an insulating structure. In the method, after an insulating interlayer is formed on a substrate using a silicon source gas and a reaction gas, a capping layer is formed in-situ on the insulating interlayer by increasing a flow rate of an oxidizing gas included in the reaction gas. Here, the capping layer has a second thickness when the insulating interlayer having a first thickness is formed on the substrate.

In one embodiment, the silicon source gas may include at least one of silane ($SiH_4$), silicon tetrafluoride ($SiF_4$), tetraethylorthosilane (TEOS), tetramethylorthosilane (TMOS), methylsilane, trimethylsilane, tetramethylsilane, tetramethyl-cyclotetrasiloxane, and dimethyl-dimethoxysilicate. The reaction gas may include at least one of a carbonated gas, a hydrogen gas, a fluorine gas and the oxidizing gas. The insulating interlayer and the capping layer may include silicon hydroxide (SiOH), silicon oxycarbonate (SiOC) or silicon oxyfluoride (SiOF). The capping layer has an oxygen concentration higher than that of the insulating interlayer.

In another embodiment, the insulating layer and the capping layer are formed by a plasma enhanced chemical vapor deposition process. The first thickness corresponds to a thickness of a metal wiring structure formed in the insulating structure by a damascene process, and the second thickness corresponds to a thickness of a protection layer employed in a chemical mechanical polishing process for forming the metal wiring structure.

In accordance with another aspect of the present invention, there is provided a method of forming a metal wiring structure of a semiconductor device. In the method, an insulating interlayer is formed on a substrate including a conductive pattern using a silicon source gas and a reaction gas. A capping layer having a second thickness is formed in-situ on the insulating interlayer by increasing a flow rate of an oxidizing gas included in the reaction gas when the insulating interlayer is formed on the substrate to have a first thickness. A metal wiring structure electrically connected to the conductive pattern is formed through the capping layer and the insulating interlayer.

The metal wiring structure may be formed according to a single or a dual damascene process.

In one embodiment, forming the metal wiring structure further comprises: forming a trench exposing the conductive pattern by partially etching the capping layer and the insulating interlayer; forming a barrier layer having a uniform thickness in the trench; forming a metal layer filling the trench on the barrier layer; and partially etching forming the metal layer by a chemical mechanical polishing process to form the metal layer in the trench.

In another embodiment, forming the metal wiring structure further comprises: forming a contact hole exposing the conductive pattern by partially etching the capping layer and the insulating layer; forming a trench on the contact hole by partially etching the capping layer and the insulating layer; forming a barrier layer in the trench and in the contact hole; forming a metal layer filling the contact hole and the trench on the a barrier layer; and partially etching the metal layer by a chemical mechanical polishing process to form the metal wiring structure in the trench and in the contact hole.

The barrier layer may comprise at least one material selected from the group consisting of titanium (Ti), tantalum (Ta), tungsten (W), titanium nitride (TiN), tantalum nitride (TaN), tungsten nitride (WN), tungsten carbon nitride (WCN), titanium-silicon nitride (TiSiN), tantalum-silicon nitride (TaSiN) and tungsten silicon (WSi).

BRIEF DESCRIPTION OF THE DRAWINGS

The above and other features and advantages of the present invention will become readily apparent by reference to the following detailed description when considered in conjunction with the accompanying drawings wherein:

FIG. 2 is a flow diagram illustrating a method of forming an insulating structure and a metal wiring structure of a semiconductor device in accordance with an embodiment of the present invention;

DETAILED DESCRIPTION OF PREFERRED EMBODIMENTS

Figure 1:
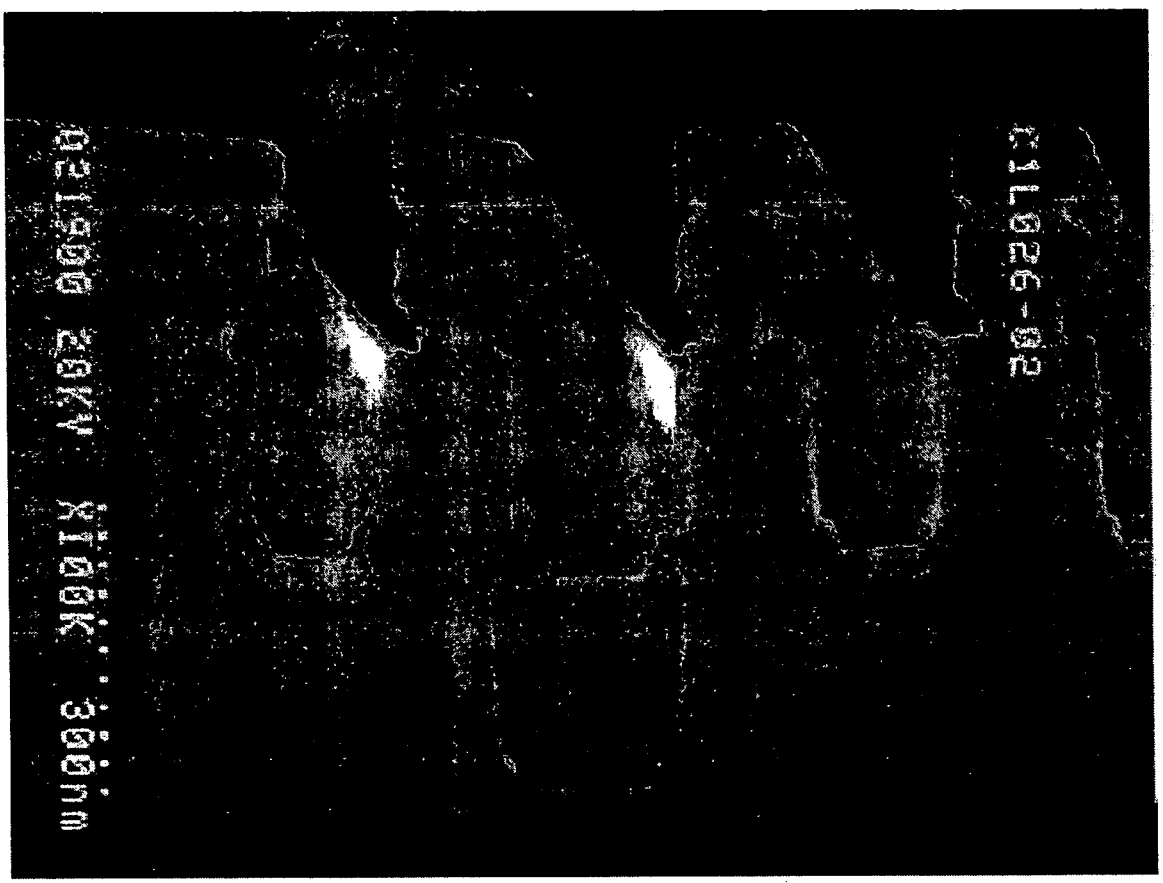
FIG. 1 is an electron microscope image illustrating a silicon oxycarbonate layer and a capping layer formed in accordance with a conventional method.

The present invention will now be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like reference numerals refer to similar or identical elements throughout. It will be understood that when an element such as a layer, region or substrate is referred to as being "on" or "onto" another element, it may lie directly on the other element or intervening elements or layers may also be present.

FIG. 2 is a flow diagram illustrating a method of forming a metal wiring structure and an insulating structure of a semiconductor device in accordance with one embodiment of the present invention.

Referring to FIG. 2, in step S100, an etching stop layer having a uniform thickness is formed on a semiconductor substrate. The semiconductor substrate may include thin films in which conductive patterns are formed. The conductive patterns may include copper (Cu), aluminum (Al), tungsten (W), silver (Ag), gold (Au) or platinum (Pt).

In steps S110 and S120, an insulating structure is formed on the substrate on which the etching stop layer is formed. Particularly, in step S110, an insulating interlayer is formed on the etching stop layer using a source gas including silicon and a reaction gas including a carbonated gas (carbon-containing gas), a hydrogen gas, a fluorine gas or an oxidizing gas (oxygen-containing gas). The insulating interlayer is formed by a plasma enhanced chemical vapor deposition process. Alternatively, the reaction gas may include two, or more than two, gases among the carbonated gas, the hydrogen gas, the fluorine gas and the oxidizing gas. After the insulating interlayer is formed on the etching stop layer to a first thickness, a capping layer is formed on the insulating interlayer to a second thickness by increasing the flow rate of the oxygen gas included in the reaction gas in the step S120. That is, the capping layer is formed in-situ on the insulating interlayer by a plasma enhanced chemical vapor deposition process. Thus, the insulating structure is formed on the etching stop layer.

The source gas may include silane ($SiH_4$), silicon tetrafluoride ($SiF_4$), tetraethyloxysilane (TEOS), tetramethylpxysilane (TMOS), methylsilane, dimethylsilane, trimethylsilane, tetramethyl-cyclotetrasiloxane, or dimethyl-dimethoxysilane, or combinations thereof. The oxidizing gas may include oxygen ($O_2$), ozone ($O_3$), dinitrogen monoxide ($N_2O$), carbon monoxide (CO), carbon dioxide ($CO_2$), or water vapor ($H_2O$), or combinations thereof.

The insulating interlayer may include silicon oxycarbonate (SiOC), silicon oxyfluoride (SiOF) or silicon hydroxide (SiOH), or combinations thereof. The capping layer also may include silicon oxycarbonate (SiOC), silicon oxyfluoride (SiOF) or silicon hydroxide (SiOH), or combinations thereof. The capping layer has an oxygen concentration that is higher than that of the insulating interlayer. For example, the insulating interlayer includes silicon oxycarbonate of a low dielectric constant formed by a plasma enhanced chemical vapor deposition (PECVD) process, whereas the capping layer includes silicon oxycarbonate having a relatively high oxygen concentration and a relatively high carbon concentration.

The first thickness of the insulating interlayer may correspond to substantially a thickness of a metal wiring structure that will be formed by a damascene process. The second thickness of the capping layer may correspond to substantially a thickness of a protection layer employed for forming the metal wiring structure by a chemical mechanical polishing (CMP) process.

Since the insulating interlayer of the low dielectric constant has a poor mechanical strength, the capping layer mitigates or prevents formation of micro scratches or exfoliation of the insulating interlayer in the CMP process for forming the metal wiring structure.

In the present invention, the insulating structure including the insulating interlayer and the capping layer does not have an interface between the insulating interlayer and the capping layer because the insulating interlayer and the capping layer are formed in situ. Therefore, cleaning solution will not permeate into the insulating structure, thereby preventing damage to the insulating interlayer during subsequent cleaning processes. In addition, leakage current is less likely to be generated between the insulating interlayer and the capping layer, improving reliability of the insulating structure of the semiconductor device.

Referring now to FIG. 2, in step S130, after a photoresist pattern is formed on the capping layer of the insulating structure, the insulating structure and the etching stop layer are partially etched using the photoresist pattern as an etching mask to thereby form an opening that exposes the conductive pattern. Here, the capping layer and the insulating interlayer are etched to form the opening. The opening may in the form of a hole for a single damascene process or in the form of a hole and a trench for a dual damascene process.

In step S140, after removing the photoresist pattern, for example, using an ashing and stripping process, a barrier layer is formed on a sidewall of the opening and on the conductive pattern. The barrier layer may include titanium (Ti), tantalum (Ta), tungsten (W), titanium nitride (TiN), tantalum nitride (TaN), tungsten nitride (WN), tungsten carbon nitride (WCN), titanium-silicon nitride (TiSiN), tantalum-silicon nitride (TaSiN), tungsten-silicon nitride (WsiN), or a combination thereof. The barrier layer prevents metal included in the metal wiring structure from diffusing into the insulating structure during a subsequent process for forming the metal wiring structure. The barrier layer may be formed in a chemical vapor deposition (CVD) process, a physical vapor deposition (PVD) process, a sputtering process, an atomic layer deposition (ALD) process, an electron-beam evaporation process, an electroless deposition process, an electrolytic deposition process, or other suitable process.

In step S150, a metal layer is formed on the insulating structure to fill up the opening. In one example, the metal layer includes copper (Cu).

In step S160, the metal layer is etched by a CMP process until the insulating structure is exposed to thereby form the metal wiring structure in the opening. As a result, the semiconductor device including the metal wiring structure and the insulating structure is formed on the substrate.

In the above-described embodiment of the present invention, the insulating structure including the insulating interlayer and the capping layer does not have an interface between the insulating interlayer and the capping layer because the insulating interlayer and the capping layer are formed in situ. Thus, cleaning solution used during subsequent cleaning processes is less likely to permeate into the insulating structure, thereby preventing damage to the insulating interlayer. In addition, leakage current is less likely to be present between the insulating interlayer and the capping layer, improving reliability in the semiconductor device including the insulating structure.

FIGS. 3A to 3J are cross-sectional views illustrating a method of forming metal wiring structures through insulating structures in a single damascene process in accordance with an embodiment of the present invention.

Figure 3A:
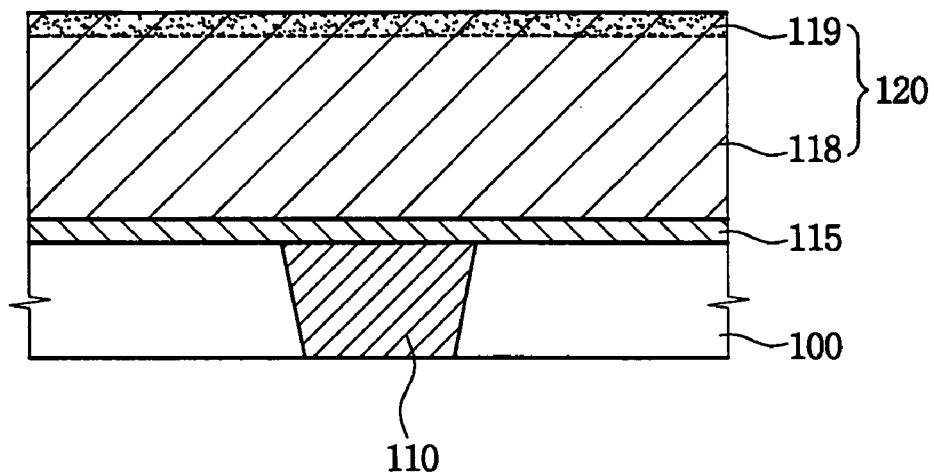
FIGS. 3A to 3J are cross-sectional views illustrating a method of forming a metal wiring structure through an insulating structure using a single damascene process in accordance with an embodiment of the present invention.

Referring to FIG. 3A, a first etching stop layer 115 and a first insulating structure 120 are successively formed on a silicon substrate 100 including a conductive pattern 110. For example, the conductive pattern 110 is formed using copper. The first insulating structure 120 includes a first insulating interlayer 118 and a first capping layer 119. The first insulating interlayer 118 may comprise a material having a low dielectric constant such as silicon hydroxide (SiOH), silicon oxycarbonate (SiOC), silicon oxyfluoride (SiOF), or other suitable material. In one embodiment, the first insulating interlayer 118 is advantageously formed using silicon oxycarbonate.

Hereinafter, a process of forming the first insulating structure 120 including the first insulating interlayer 118 and the first capping layer 119 will be described in detail.

After loading the substrate 100 onto a susceptor of a plasma enhanced chemical vapor deposition (PECVD) chamber, the substrate 100 is thermally treated at a temperature of about 150 to about 450° C. A temperature of the showerhead of the chamber is in the range of about 150 to about 200° C. and a temperature of the wall of the chamber is in the range of about 100 to about 150° C.

An inactive gas, for example a helium gas, an argon gas or a nitrogen gas, is introduced into the chamber having a vacuum pressure at a flow rate of about 50 to about 150 sccm so that the chamber has a pressure of about 500 to about 800 Pa.

When the pressure of the chamber is maintained at about 500 to about 800 Pa, a radio frequency (RF) power of about 800 to about 1700 W is applied to the chamber. A silane ($SiH_4$) gas, a carbonated gas and an oxidizing gas are introduced into the chamber at flow rates of about 150 to about 200 sccm. Plasma of the silane gas, the carbonated gas and the oxidizing gas is generated by applying the RF power to the silane and the carbon gases.

The plasma of the silane gas, the carbonated gas and the oxidizing gas are reacted with silicon included in the substrate 100 to thereby form the first insulating interlayer 118 including silicon oxycarbonate on the first etching stop layer 115 positioned on the substrate 100. In the process for forming the first insulating interlayer 118 of silicon oxycarbonate on the first etching stop layer 115, the process may be performed for about a predetermined time T1 so that the insulating interlayer 118 of silicon oxycarbonate has a first thickness substantially identical to that of a successively formed first metal wiring structure 135a (see FIG. 3E).

After the first insulating interlayer 118 having the first thickness is formed on the substrate 100 including the first etching stop layer 115, the first capping layer 119 is formed in-situ on the first insulating interlayer 118. The first capping layer 119 is formed by continuing to introduce the silane gas, the carbonated gas and the oxidizing gas into the chamber. Here, the flow rates of the silane gas and the carbonated gas are maintained at about 150 to about 200 sccm, whereas the flow rate of the oxidizing gas is gradually increased during the formation of the first capping layer 119. That is, the flow rate of the oxidizing gas during formation is made to be greater than the previous level of about 150 to about 200 sccm used to form the first insulating interlayer 118. As a result, the first capping layer 119 has an oxygen concentration that is higher than that of the first insulating interlayer 118. Because the first capping layer 119 is formed in-situ on the first insulating interlayer 118 by varying the flow rate of the oxidizing gas, a physical interface is not generated between the first insulating interlayer 118 and the first capping layer 119. That is, the first capping layer 119 is integrally formed on the first insulating interlayer 118.

Since the first capping layer 119 has an oxygen concentration that is higher than that of the first insulating interlayer 118, the first capping layer 119 has a mechanical strength higher than that of the first insulating layer 118. Hence, the first capping layer 119 operates to protect the first insulating interlayer 118 from being damaged during a subsequent CMP process used during formation of the first metal wiring structure 135a.

Figure 3B:
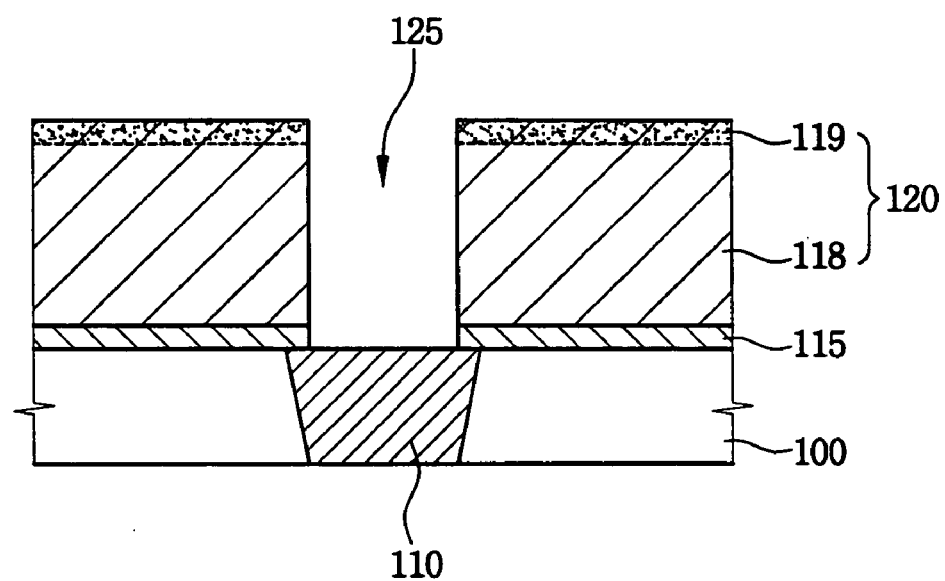

Referring to FIG. 3B, a photoresist pattern (not shown) is formed on the first insulating structure 120. The photoresist pattern is used as an etching mask pattern for forming a hole 125 exposing the conductive pattern 110. Using the photoresist pattern as an etching mask, the first capping layer 119, the first insulating interlayer 118 and the first etching stop layer 115 are anisotropically etched to form the hole 125 that exposes the conductive pattern 110. Namely, the hole 125 occupies a space from the first capping layer 119 to the first etching stop layer 115. Then, the photoresist pattern is removed from the first capping layer 119 using an ashing and stripping process.

Figure 3C:
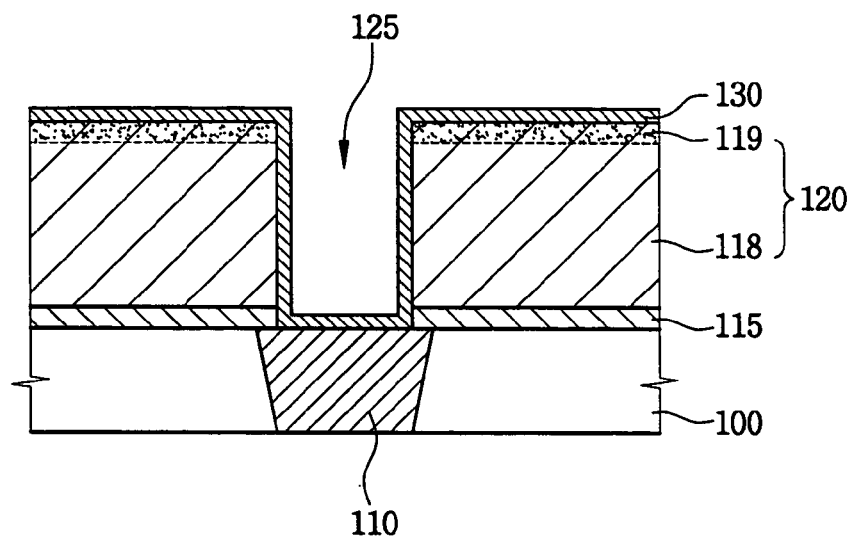

Referring to FIG. 3C, a first barrier layer 130 having a uniform thickness is formed on the first capping layer 119, on a sidewall of the hole 125 and on the exposed conductive pattern 110. The first barrier layer 130 prevents the diffusion of copper included in the first metal wiring structure 135a during the subsequent process for forming the first metal wiring structure 135a. The first barrier layer 130 may be formed using titanium (Ti), tantalum (Ta), tungsten (W), titanium nitride (TiN), tantalum nitride (TaN), tungsten nitride (WN), tungsten carbon nitride (WCN), titanium-silicon nitride (TiSiN), tantalum-silicon nitride (TaSiN), tungsten-silicon nitride (WSiN), or a combination thereof.

Figure 3D:
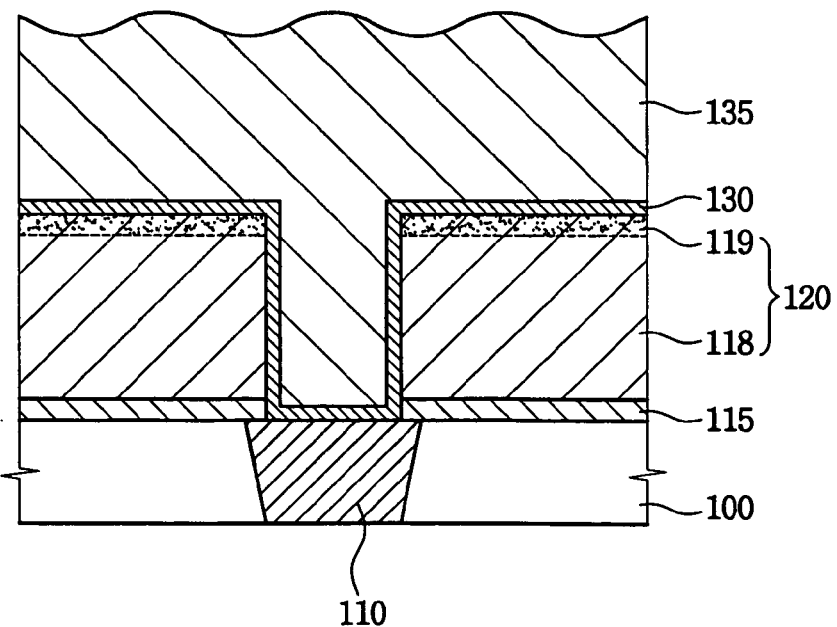
Figure 3E:
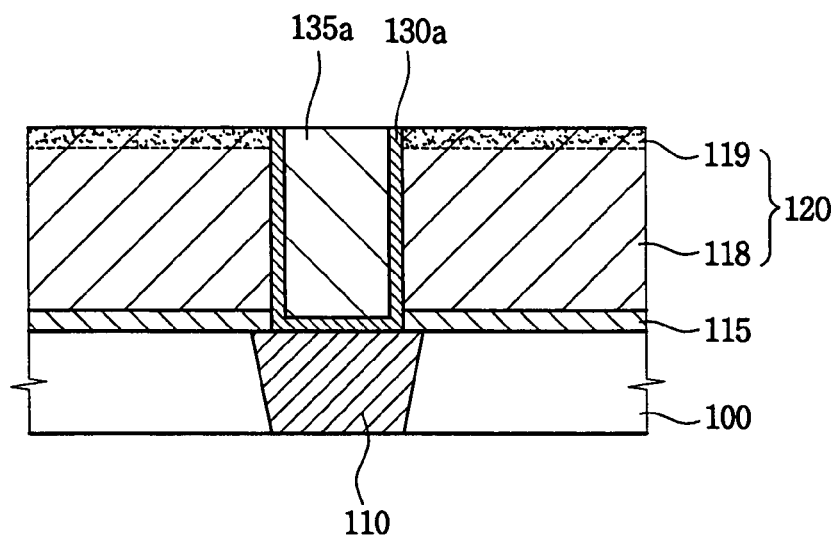

Referring to FIGS. 3D and 3E, a first metal layer 135 is formed on the first barrier layer 130 to fill the hole 125. For example, the first metal layer 135 includes copper. The first metal layer 135 may be formed by a CVD process, a PVD process, an ALD process, an electron-beam evaporation process, an electroless deposition process, an electrolytic deposition process, or other suitable process.

Since the first metal layer 135 has an irregular surface, a CMP process is performed on the first metal layer 135 and the first barrier layer 130 until the first capping layer 119 is exposed. The capping layer 119 protects the underlying first insulating layer 118 from damage, as described above. As a result, the resulting first metal wiring structure 135a is provided in the hole 125. Here, a first barrier layer pattern 130a is formed on the sidewall of the hole 125 and on the conductive pattern 110. That is, the first barrier layer pattern 130a is interposed between the conductive pattern 110 and the first metal wiring structure 135a. Additionally, the first barrier layer pattern 130a is positioned between the first metal wiring structure 135a and the sidewall of the hole 125. The first metal wiring structure 135a positioned in the first insulating structure 120 is electrically connected to the conductive pattern 110.

A passivation layer (not shown) may be formed on the first metal wiring structure 135a and on the first insulating structure 120 to prevent the first metal wiring structure 135a from being contaminated by external contaminants or subsequent processes for forming the semiconductor device. The passivation layer may be formed, for example, using aluminum oxide, silicon oxide, tantalum oxide, or titanium oxide. Alternatively, the passivation layer may be formed using aluminum nitride, silicon nitride, tantalum nitride, or titanium nitride.

Figure 3F:
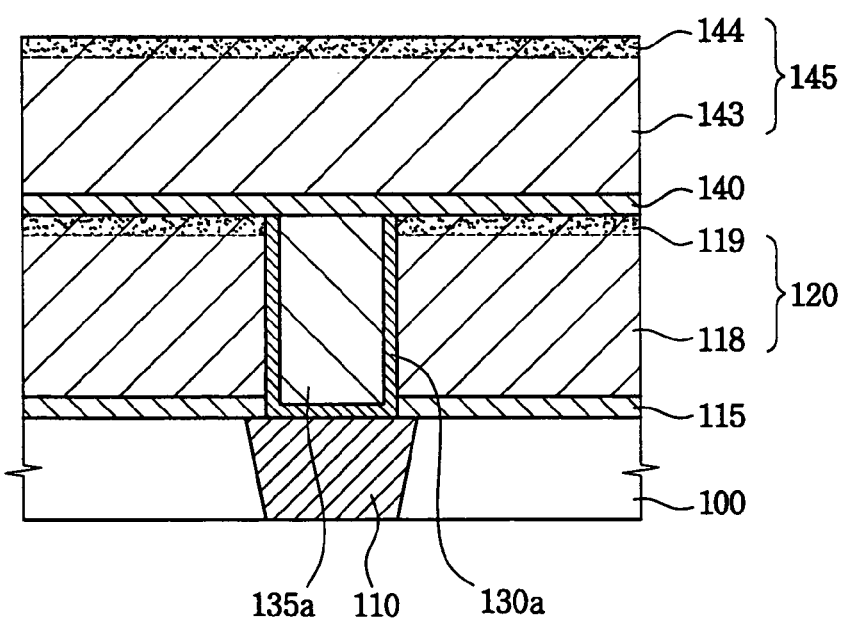

Referring to FIG. 3F, after a second etching layer 140 is formed on the first metal wiring structure 135a and on the first insulating structure 120, a second insulating structure 145 is formed on the second etching stop layer 140. The second insulating structure 145 includes a second insulating interlayer 143 formed on the second etching stop layer 140, and a second capping layer 144 formed on the second insulating interlayer 143. The second insulting interlayer 143 may be formed using a material having a low dielectric constant such as silicon hydroxide, silicon oxycarbonate, silicon oxyfluoride, or other suitable material. Preferably, the second insulating layer 143 is advantageously formed using silicon oxycarbonate. The second capping layer 144 is formed on the second insulating interlayer 143 using the method described above in connection with the formation of the first capping layer 119 on the first insulating interlayer 118, in accordance with the present invention.

Figure 3G:
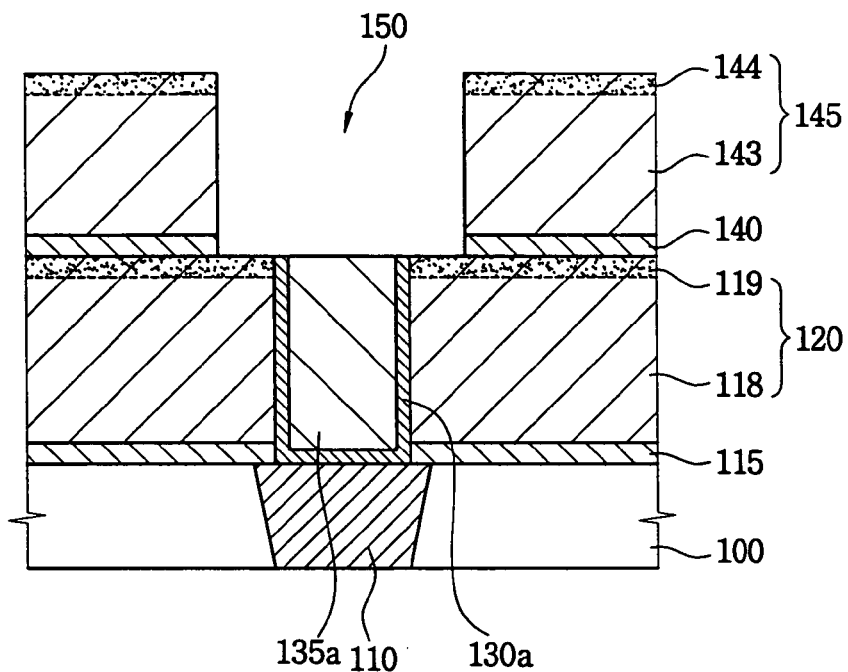

Referring FIG. 3G, a photoresist pattern (not shown) is formed on the second capping layer 144 of the second insulating structure 145 to form a trench 150 exposing the first metal wiring structure 135a.

When the second insulating structure 145 and the second etching stop layer 140 are partially etched using the photoresist pattern as an etching mask, the trench 150 is formed through the second insulating structure 145 and the second etching stop layer 140. Here, the second capping layer 144, the second insulating interlayer 143 and the second etching stop layer 140 are anisotropically etched to thereby form the trench 150 that exposes the first metal wiring structure 135a. The trench 150 has a width that is wider than that of the hole 125. Then, the photoresist pattern is removed from the second insulating structure 145 using an ashing and stripping process.

Figure 3H:
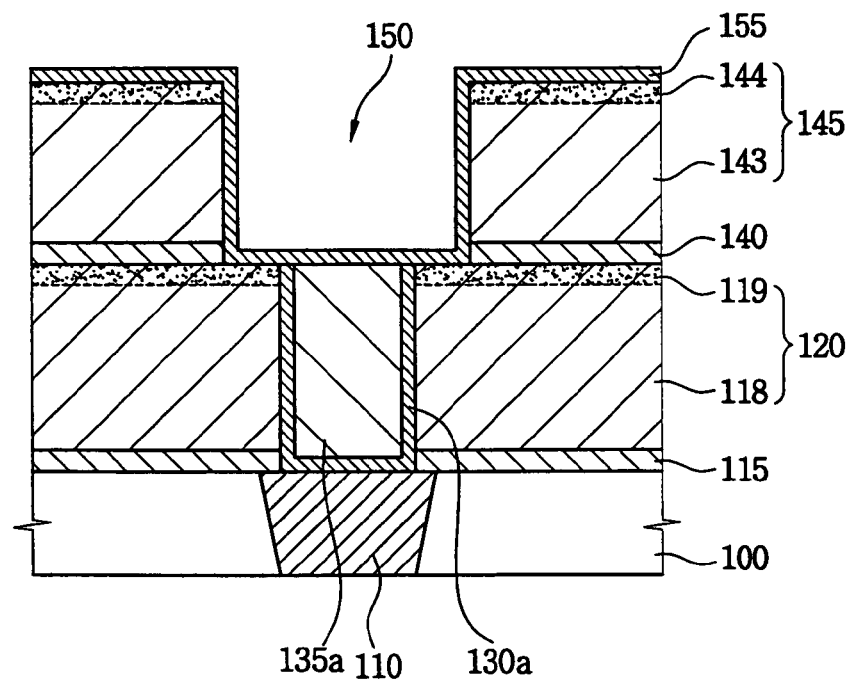

Referring to FIG. 3H, a second barrier layer 155 having a uniform thickness is formed on the second capping layer 144, on an sidewall of the trench 150 and on the first metal wiring structure 135a. The second barrier layer 155 prevents copper included in a second metal wiring structure 160a (see FIG. 3J) from diffusing into the second insulating structure 145. The second barrier layer 155 may be formed using titanium, tantalum, tungsten, titanium nitride, tantalum nitride, tungsten nitride, tungsten carbon nitride, titanium-silicon nitride, tantalum-silicon nitride, tungsten-silicon, or a combination thereof.

Figure 3I:
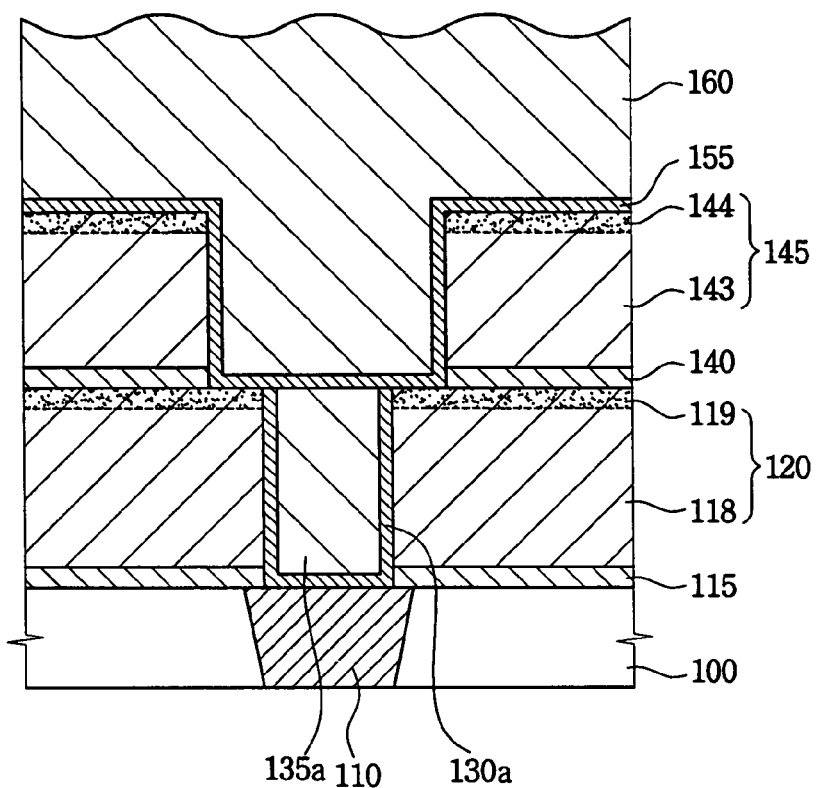
Figure 3J:
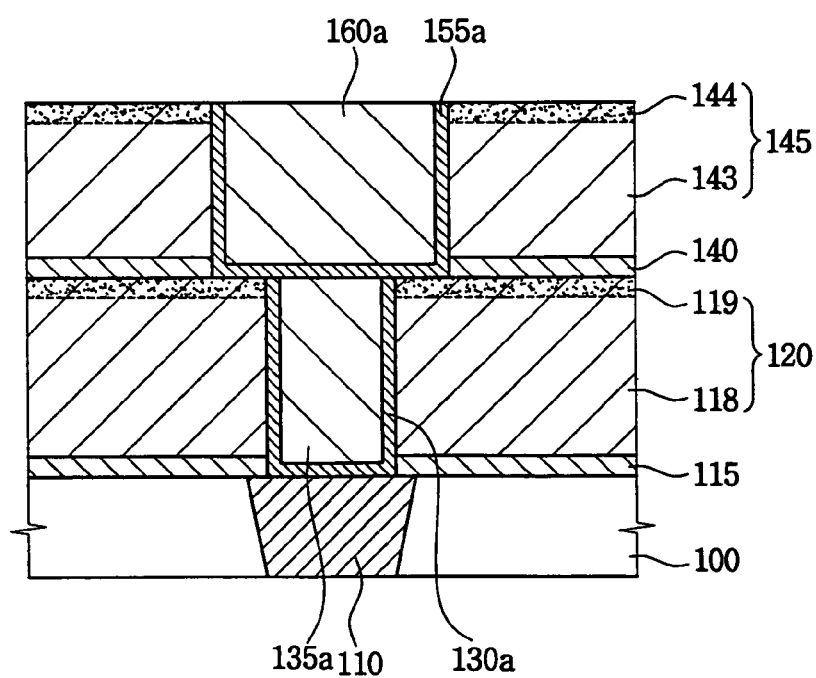

Referring to FIGS. 3I and 3J, a second metal layer 160 is formed on the second barrier layer 155 to fill the trench 150. For example, the second metal layer 160 is formed using copper. The second metal layer 160 may be formed by a CVD process, a PVD process, an ALD process, an electron-beam evaporation process, an electroless deposition process, a electrolytic deposition process, or other suitable process.

Portions of the second metal layer 160 and the second barrier layer 155 are etched by a CMP process until the second capping layer 144 is exposed. As described above, the second capping layer 144 protects the underlying second insulating interlayer 143 during the CMP process. A second barrier layer pattern 155a and the second metal wiring structure 160a are thus formed in the trench 150. The second barrier layer pattern 155a is formed on the first metal wiring structure 135a and on the sidewall of the trench 150. The second metal wiring structure 160a is positioned on the second barrier layer pattern 155a. Therefore, a wiring structure including the first and second metal wiring structures 135a and 160a is formed on the substrate 100 through the first and second insulating structures 120 and 145.

As described above, a second passivation layer (not shown) may be formed on the second metal wiring structure 160a and on the second insulating structure 145 to prevent the second metal wiring structure 160a from being contaminated by external contaminants or subsequent processes for forming the semiconductor device. Here, the passivation layer may be formed using oxide or nitride of aluminum, silicon, tantalum or titanium.

FIGS. 4A to 4F are cross-sectional views illustrating a method of forming a metal wiring structure through insulating structures in a dual damascene process in accordance with another embodiment of the present invention.

Figure 4A:
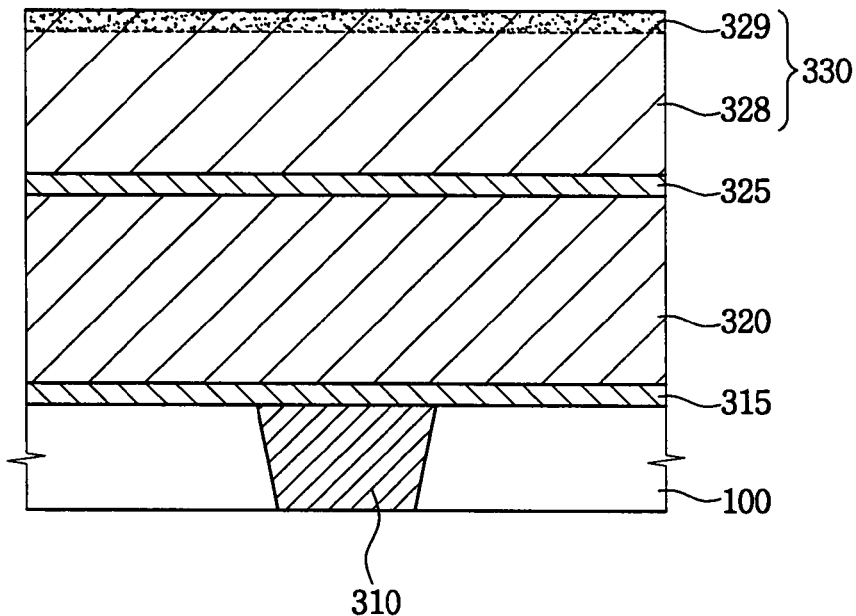
FIGS. 4A to 4F are cross-sectional views illustrating a method of forming a metal wiring structure through an insulating structure using a dual damascene process in accordance with another embodiment of the present invention.

Referring to FIG. 4A, after a first etching stop layer 315 is formed on a semiconductor substrate 100 having a conductive pattern 310, a first insulating structure including a first insulating interlayer 320 is formed on the first etching stop layer 315. A second etching stop layer 325 is formed on the first insulating structure 320, and then a second insulating structure 330 is formed on the second etching stop layer 325. The second insulating structure 330 includes a second insulating interlayer 328 formed on the second etching stop layer 325 and a capping layer 329 formed on the second insulating interlayer 328.

In the present embodiment, the first insulating structure 320 includes one layer, whereas the second insulating interlayer 330 includes two layers. The first insulating interlayer may be formed using a material having a low dielectric constant such as silicon hydroxide, silicon oxycarbonate or silicon oxyfluoride. The second insulating interlayer 328 may be formed using a material substantially identical to that of the first insulating interlayer. Preferably, the first and second insulating interlayers 320 and 328 are formed using silicon oxycarbonate. The capping layer 329 is formed on the second insulating interlayer 328 using the method described above in connection with the formation of the first capping layer 119 on the first insulating interlayer 118, in accordance with the present invention.

A first photoresist pattern (not shown) is formed on the capping layer 329 of the second insulating structure 330 to form a hole 340 exposing a portion of the first etching stop layer 315 through the first and second insulation structures 320 and 330, and the second etching stop layer 325.

Figure 4B:
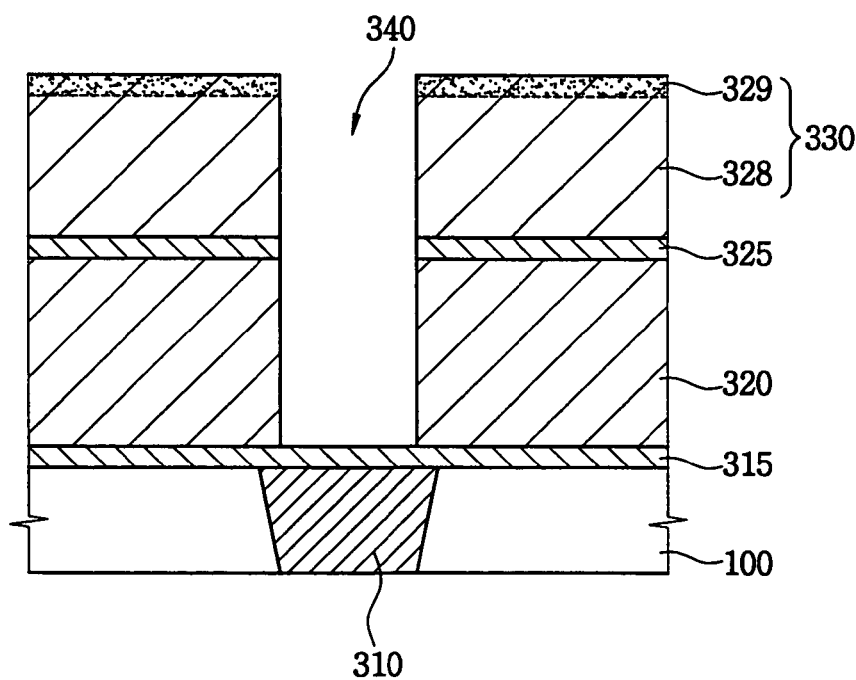

Referring to FIG. 4B, portions of the second insulating structure 330, the second etching stop layer 329 and the first insulating structure 320 are anisotropically etched using the first photoresist pattern as an etching mask to form the hole 340. Namely, the capping layer 329, the second insulating interlayer 328, the second etching stop layer 325 and the first insulating interlayer are partially etched to thereby form the hole 340. The hole 340 exposes a portion of the first etching stop layer 315 under which the conductive pattern 310 is positioned. Here, the etching process for forming the hole 340 is carried out until the first etching stop layer 315 is exposed. The first photoresist pattern is then removed from the second insulating structure 330 by an ashing and stripping process.

Figure 4C:
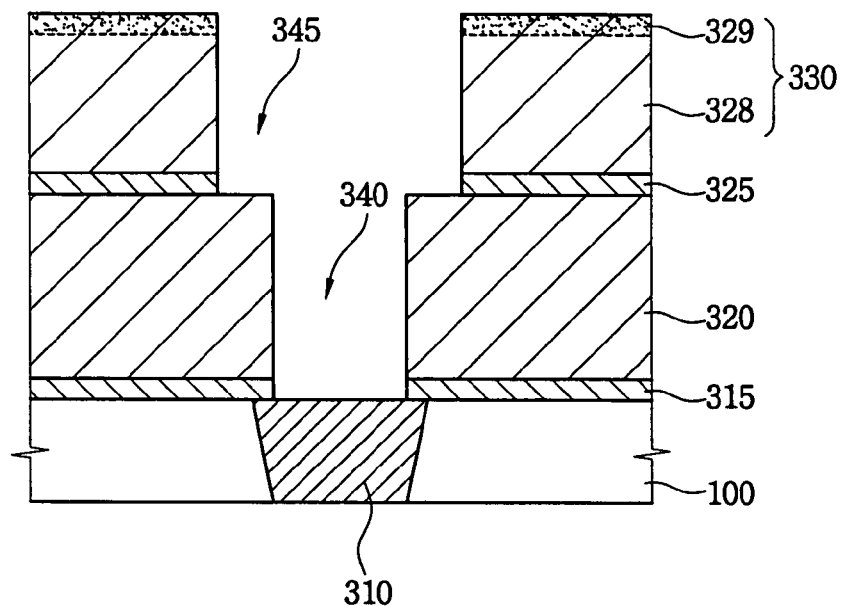

Referring to FIG. 4C, after a second photoresist pattern (not shown) is formed on the capping layer 329 of the second insulating structure 330, the second insulating structure 330 is anisotropically etched using the second photoresist pattern as an etching mask, thereby forming a trench 345 that exposes the hole 340 through the second insulating structure 330. That is, portions of the capping layer 329 and the second insulating interlayer 328 are etched to form the trench 345 therethrough. The trench 345 has a width that is wider than that of the hole 340. After forming the trench 345, the first etching stop layer 315 is partially etched so that the conductive pattern 310 is exposed through the hole 340 and the trench 345.

Figure 4D:
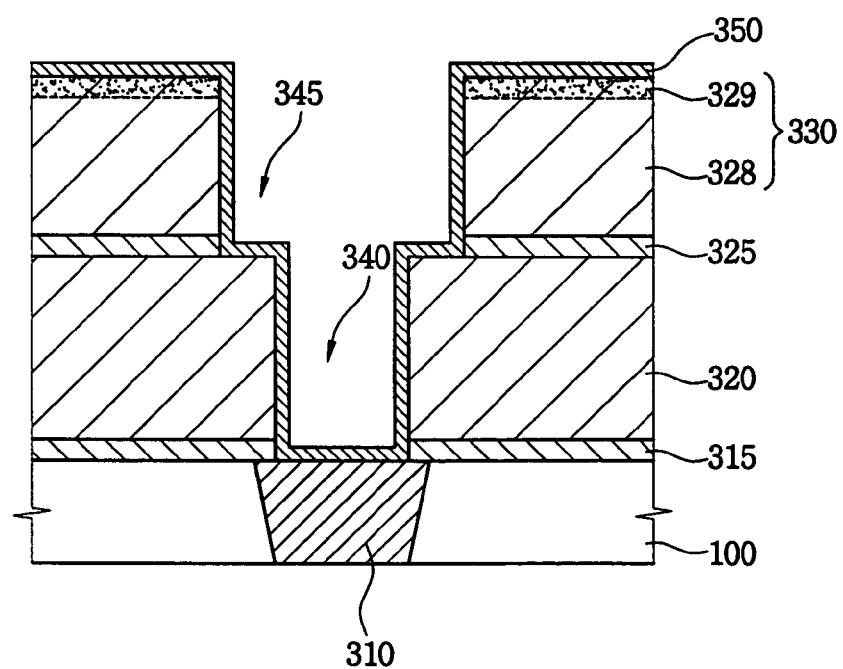

Referring to FIG. 4D, a barrier layer 350 having a uniform thickness is formed on sidewalls of the trench 345 and the hole 340, on the exposed conductive pattern 310, and on the capping layer 329. The barrier layer 350 prevents metal included in a metal wiring structure 360a having a dual damascene-structure (see FIG. 4F) from diffusing into the first and second insulating structures 320 and 330. The barrier layer 350 may be formed using titanium, tantalum, tungsten, titanium nitride, tantalum nitride, tungsten nitride, tungsten carbon nitride, titanium-silicon nitride, tantalum-silicon nitride, tungsten-silicon nitride, or other suitable material.

Figure 4E:
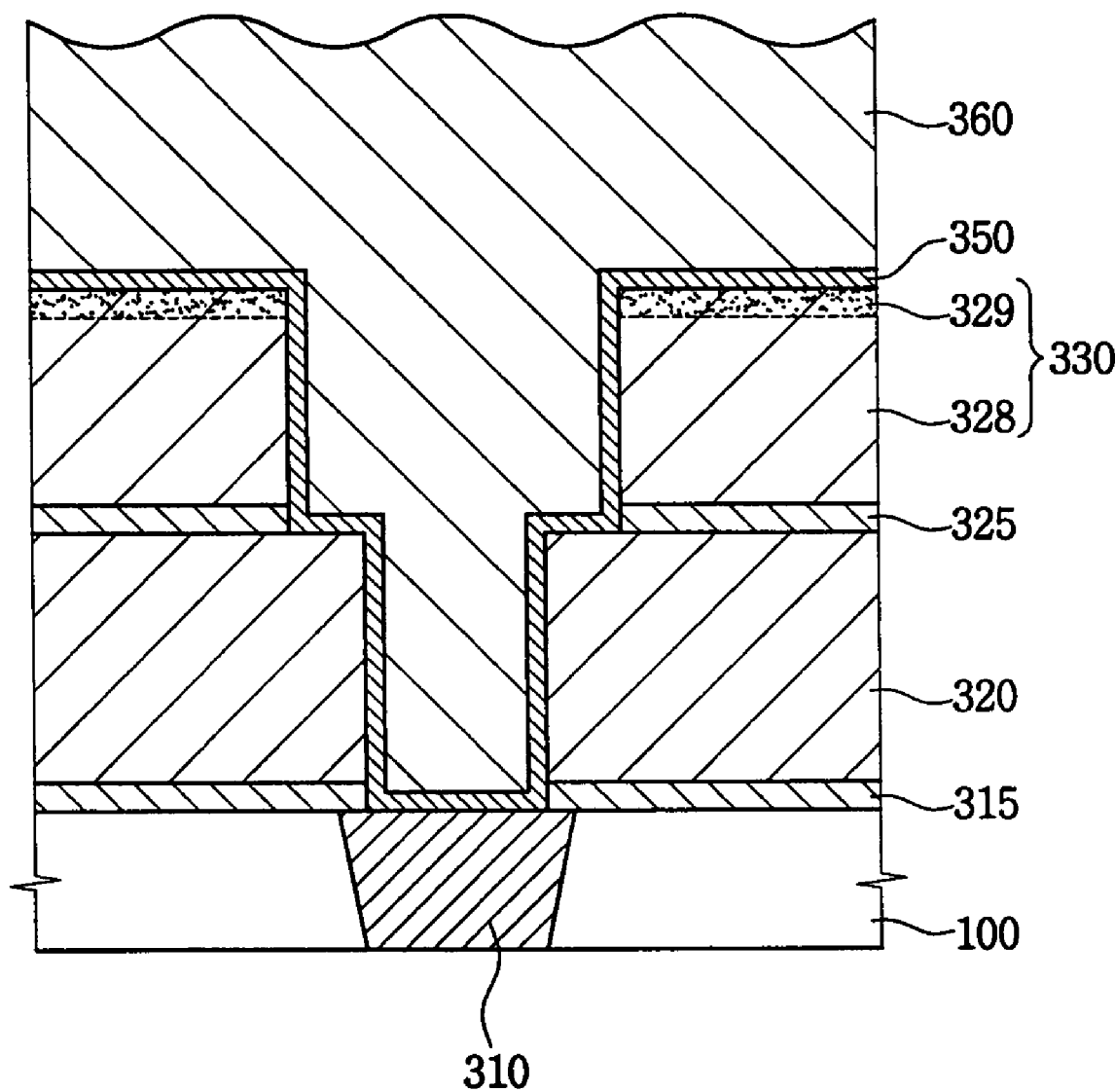
Figure 4F:
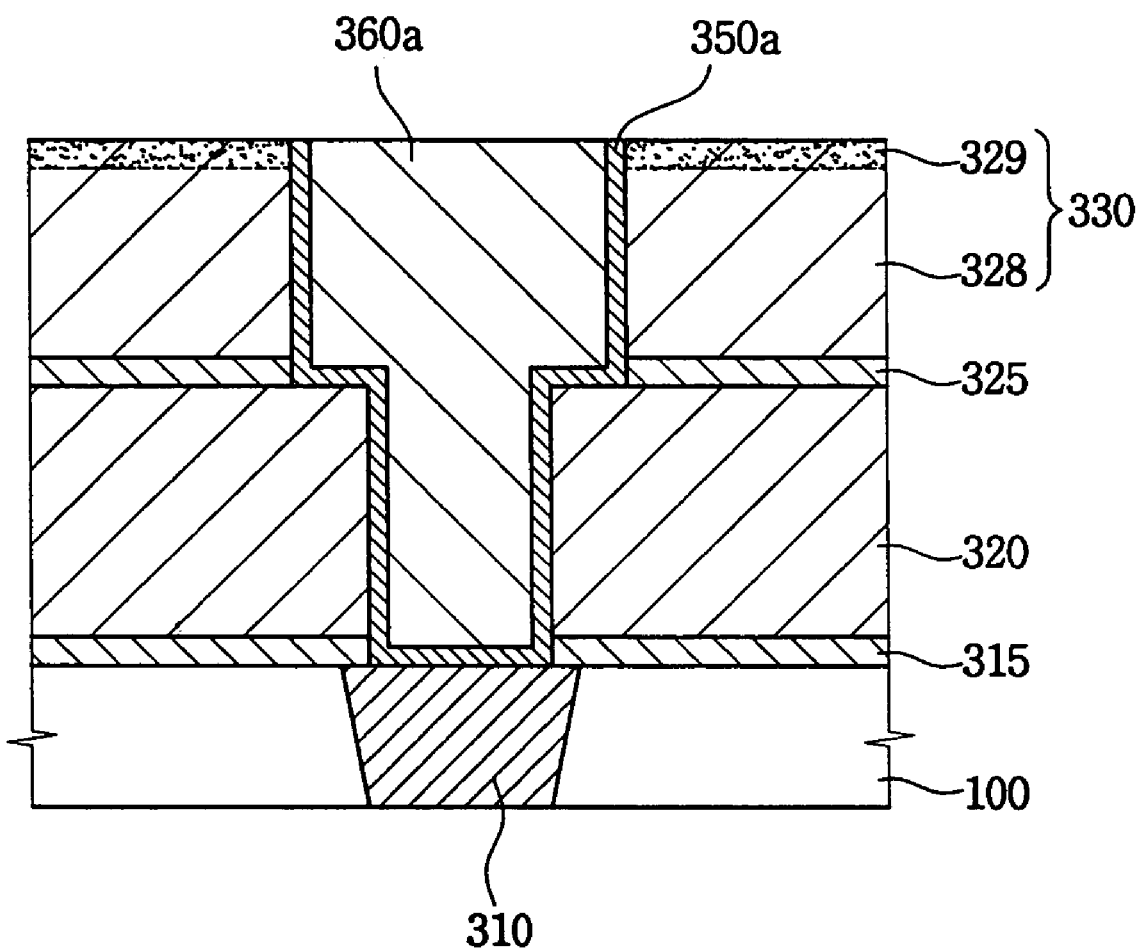

Referring to FIGS. 4E and 4F, a metal layer 360 is formed on the second insulating structure 330 to fill the hole 340 and the trench 345. The metal layer 360 is preferably formed using copper. The metal layer 360 may be formed by a CVD process, a PVD process, an ALD process, an electron-beam evaporation process, an. electroless deposition process, an electrolytic deposition process, or other suitable process.

Portions of the metal layer 360 and the barrier layer 350 are etched by a CMP process until the second insulating structure 330 is exposed, thereby forming a barrier layer pattern 350a and the metal wiring structure 360a having the dual damascene structure in the hole 340 and trench 345. As described above, the capping layer 329 protects the underlying second insulating interlayer 328 during the CMP process. The barrier layer pattern 350a is formed on the conductive pattern 310 and on the sidewalls of the hole 340 and the trench 345. The metal wiring structure 360a is formed on the barrier layer pattern 350a.

As described above, a passivation layer (not shown) may be formed on the metal wiring structure 360a and on the second insulating structure 330 to prevent the metal wiring structure 360a from being contaminated by external contaminants or subsequent processes for forming the semiconductor device.

According to the present invention, an insulating structure includes a capping layer that is integrally formed with an underlying insulating interlayer, and therefore there is no physical interface between the capping layer and the insulating interlayer. Thus, the insulating interlayer is not damaged by a cleaning solution during a subsequent cleaning process, since the cleaning solution may not permeate into the insulating structure. In addition, leakage current is mitigated or eliminated between the insulating interlayer and the capping layer, improving the reliability of a semiconductor device employing the insulating structure.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of forming an insulating structure comprising:
    forming an insulating interlayer on a substrate to a first thickness using a silicon source gas and a reaction gas, the reaction gas including an oxidizing gas, the oxidizing gas having a first flow rate and the silicon source gas having a second flow rate during formation of the insulating interlayer; and
    in-situ forming a capping layer having a second thickness on the insulating interlayer, the capping layer comprising a material that is a same material as that of the insulating interlayer, and further having a higher oxygen concentration than the insulating interlayer, by increasing the flow rate of the oxidizing gas included in the reaction gas to a third flow rate that is greater than the first flow rate while maintaining the silicon source gas at the second flow rate.

2. The method of claim 1, wherein the silicon source gas includes at least one selected from the group consisting of silane ($SiH_4$), silicon tetrafluoride ($SiF_4$), tetraethylorthosilane (TEOS), tetramethylorthosilane (TMOS), methylsilane, trimethylsilane, tetramethylsilane, tetramethyl-cyclotetrasiloxane and dimethyl-dimethoxysilicate.

3. The method of claim 1, wherein the reaction gas includes at least one selected from the group consisting of a carbonated gas, a hydrogen gas, a fluorine gas and the oxidizing gas.

4. The method of claim 1, wherein the insulating interlayer and the capping layer comprises the same material that is selected from the group consisting of silicon hydroxide (SiOH), silicon oxycarbonate (SiOC) and silicon oxyfluoride (SiOF), and wherein the capping layer has an oxygen concentration higher than that of the insulating interlayer.

5. The method of claim 4, wherein the insulating layer and the capping layer are formed by a plasma enhanced chemical vapor deposition process.

6. The method of claim 1, wherein the first thickness corresponds to a thickness of a metal wiring structure formed in the insulating structure by a damascene process, and the second thickness corresponds to a thickness of a protection layer employed in a chemical mechanical polishing process for forming the metal wiring structure.

7. A method of forming a metal wiring structure of a semiconductor device comprising:
    forming an insulating interlayer on a substrate including a conductive pattern to a first thickness using a silicon source gas and a reaction gas, the reaction gas including an oxidizing gas, the oxidizing gas having a first flow rate and the silicon source gas having a second flow rate during formation of the insulating interlayer;
    in-situ forming a capping layer having a second thickness on the insulating interlayer, the capping layer comprising a material that is a same material as that of the insulating interlayer, and further having a higher oxygen concentration than the insulating interlayer, by increasing the flow rate of the oxidizing gas included in the reaction gas to a third flow rate that is greater than the first flow rate while maintaining the silicon source gas at the second flow rate; and
    forming a metal wiring structure electrically connected to the conductive pattern by a damascene process, wherein the metal wiring structure is formed through the capping layer and the insulating interlayer.

8. The method of claim 7, wherein the silicon source gas includes at least one selected from the group consisting of silane ($SiH_4$), silicon tetrafluoride ($SiF_4$), tetraethylorthosilane (TEOS), tetramethylorthosilane (TMOS), methylsilane, trimethylsilane, tetramethylsilane, tetramethyl-cyclotetrasiloxane and dimethyl-dimethoxysilicate.

9. The method of claim 7, wherein the reaction gas includes at least one selected from the group consisting of a carbonated gas, a hydrogen gas, a fluorine gas and the oxidizing gas.

10. The method of claim 7, wherein the insulating layer and the capping layer includes the same material that is selected from the group consisting of: silicon hydroxide (SiOH), silicon oxycarbonate (SiOC) or silicon oxyfluoride (SiOF), and wherein the capping layer has an oxygen concentration higher than that of the insulating interlayer.

11. The method of claim 10, wherein the insulating layer and the capping layer are formed by a plasma enhanced chemical vapor deposition process.

12. The method of claim 7, wherein the first thickness corresponds to a thickness of the metal wiring structure formed through the insulating structure by the damascene process, and the second thickness corresponds to a thickness of a protection layer employed in a chemical mechanical polishing process for forming the metal wiring structure.

13. The method of claim 7, wherein the damascene process includes a single damascene process or a dual damascene process.

14. The method of claim 13, wherein forming the metal wiring structure further comprises:
    forming a trench exposing the conductive pattern by partially etching the capping layer and the insulating interlayer;
    forming a barrier layer having a uniform thickness in the trench;
    forming a metal layer filling the trench on the barrier layer; and
    partially etching forming the metal layer by a chemical mechanical polishing process to form the metal layer in the trench.

15. The method of claim 14, wherein the barrier layer includes at least one material selected from the group consisting of titanium (Ti), tantalum (Ta), tungsten (W), titanium nitride (TiN), tantalum nitride (TaN), tungsten nitride (WN), tungsten carbon nitride (WCN), titanium-silicon nitride (TiSiN), tantalum-silicon nitride (TaSiN) and tungsten silicon (WSi).

16. The method of claim 13, wherein forming the metal wiring structure further comprises:
    forming a contact hole exposing the conductive pattern by partially etching the capping layer and the insulating layer;
    forming a trench on the contact hole by partially etching the capping layer and the insulating layer;
    forming a barrier layer in the trench and in the contact hole;

forming a metal layer filling the contact hole and the trench on the a barrier layer; and partially etching the metal layer by a chemical mechanical polishing process to form the metal wiring structure in the trench and in the contact hole.

17. The method of claim 16, wherein the barrier layer includes at least one material selected from the group consisting of titanium (Ti), tantalum (Ta), tungsten (W), titanium nitride (TiN), tantalum nitride (TaN), tungsten nitride (WN), tungsten carbon nitride (WCN), titanium silicon nitride (TiSiN), tantalum silicon nitride (TaSiN) and tungsten silicon (WSi).

* * * * *